United States Patent [19]

Kamohara et al.

[11] Patent Number: 4,664,062
[45] Date of Patent: May 12, 1987

[54] APPARATUS FOR MANUFACTURING SEMICONDUCTORS

[75] Inventors: Hideaki Kamohara; Kazumasa Fujioka; Toshiaki Kobari; Kunihiro Takahashi, all of Ibaraki; Shinjiro Ueda, Abiko, all of Japan

[73] Assignee: Hitachi, Ltd., Tokyo, Japan

[21] Appl. No.: 792,195

[22] Filed: Oct. 28, 1985

[30] Foreign Application Priority Data

Oct. 31, 1984 [JP] Japan .................. 59-227734

[51] Int. Cl.$^4$ ...................... C23C 14/02; C23C 14/56
[52] U.S. Cl. .................... 118/719; 118/723; 118/725; 118/729; 118/733
[58] Field of Search ............... 118/719, 733, 723, 725, 118/729, 50.1, 900

[56] References Cited

U.S. PATENT DOCUMENTS 3,404,661 10/1968 Mathias et al. .............. 118/719
4,201,152 5/1980 Luscher ...................... 118/712
4,498,416 2/1985 Bouchaib ................. 118/733 X Primary Examiner—Evan K. Lawrence
Attorney, Agent, or Firm—Antonelli, Terry & Wands

[57] ABSTRACT

In a molecular beam epitaxy apparatus, the loading chamber for introducing the substrates is made separable from both the preparation chamber for cleaning the substrates and the growth chamber for forming thin films onto the respective substrates, so that the evacuation of the loading chamber is possible even when the loading chamber is separated from the apparatus, thus improving the productivity thereof.

6 Claims, 4 Drawing Figures

APPARATUS FOR MANUFACTURING SEMICONDUCTORS

BACKGROUND OF THE INVENTION

This invention relates to an apparatus for manufacturing semiconductors, and more particularly to a Molecular Beam Epitaxy (MBE) apparatus with improved productivity.

Heretofore, there has been known a MBE apparatus of the type having an loading chamber, a transfer chamber and a growth chamber, wherein the loading chamber is connected to the transfer chamber through a vacuum connection such as gate valves for taking substrates into the apparatus from the outside atmosphere. The transfer chamber is disposed between the loading chamber and the growth chamber for transferring the substrates to the last mentioned chamber in which a thin film is formed on the surface of each substrate. Also, there has been known another type of MBE apparatus, for instance as disclosed in U.S. Pat. No. 4,201,152, in which no transfer chamber is provided and thereby its loading chamber is connected to a growth chamber through gate valves. In the MBE apparatus having either construction described above, however, the utilization efficiency of each portion thereof is low, for example, because the loading chamber is not used for a relatively long period of time when the growth chamber is used to form a thin film on the surface of each substrate and that evacuation of the loading chamber is commenced after the substrates have been introduced into the chamber, and thus no consideration has been given to the productivity of the apparatus.

SUMMARY OF THE INVENTION

The present invention has an object of providing a MBE apparatus with high productivity by efficiently utilizing the loading chamber in view of the problems inherent in the above conventional apparatuses.

The MBE apparatus according to the invention has a construction in which a loading chamber is provided to be separable from both a preparation chamber and a growth chamber of the apparatus and is formed with a vacuum exhausting port so that the loading chamber can accomodate substrates while separate from the apparatus. According to this construction, the time period necessary for the evacuation of the apparatus is reduced to improve the productivity by preparing a plurality of the loading chambers which have accomodated substrates and have been evacuated separately from the apparatus and by alternately connecting the thus prepared chambers to the apparatus.

According to another aspect of the invention, a substrate storage chamber is formed in the MBE apparatus connected to the above mentioned loading chamber so that the apparatus can have an advantage of reducing the necessary time period for evacuation of the transfer chamber as well as the advantage of the first aspect of the invention thereby attaining a further improvement of the productivity.

The above and other objects, features and advantages of the invention will become clear from the following description of the preferred embodiments taken in conjunction with the accompanying drawings.

DETAILED DESCRIPTION OF PREFERRED EMBODIMENTS

The present invention will be described in detail hereinunder with reference to the specific embodiments thereof.

Figure 1:
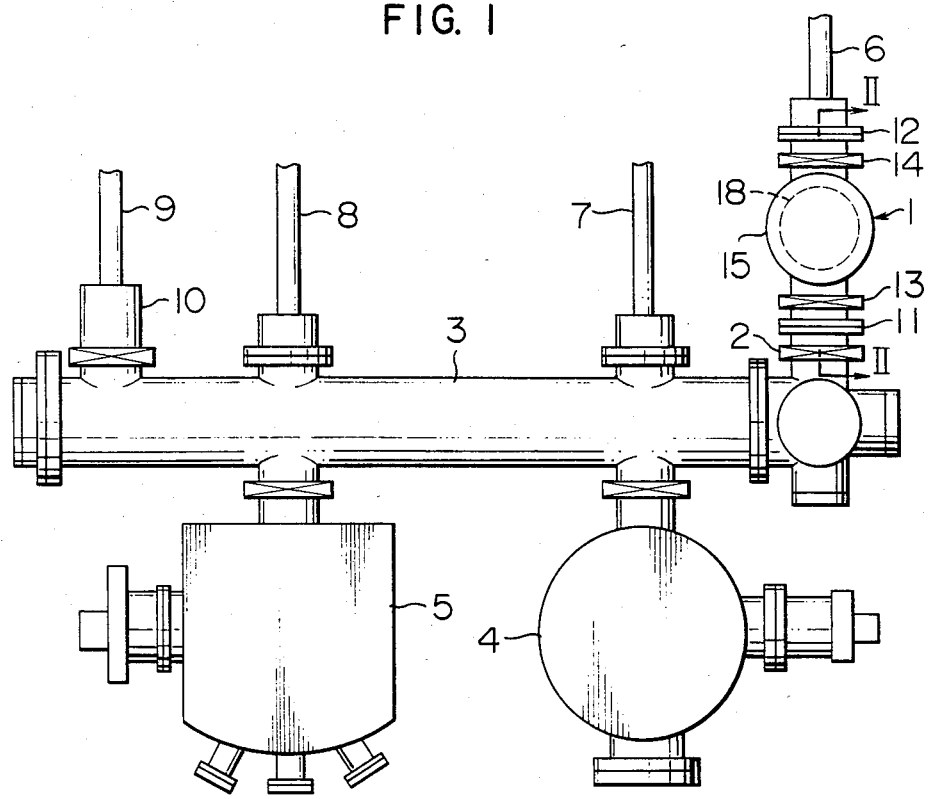
FIG. 1 is an overall view of a MBE apparatus according the invention.
Figure 2:
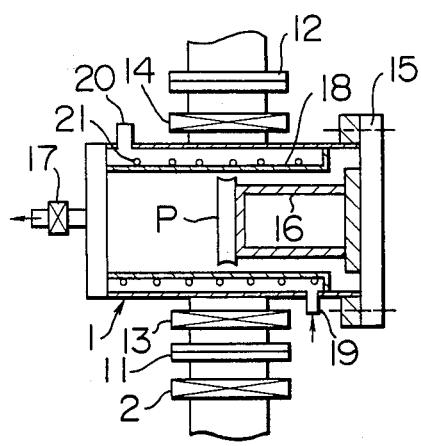
FIG. 2 is a partially sectional enlarged view of the loading chamber portion of the MBE apparatus as viewed in the direction of arrows II, II of FIG. 1.

Referring to FIGS. 1 and 2, a MBE apparatus includes an loading chamber (1) provided for introducing from an atmospheric environment a predetermined number of substrates thereinto and holding them on standby temporarily. The loading chamber (1) is connected to a transfer chamber (3) through vacuum connections (2) and (13) such as gate valves. The transfer chamber (3) is connected to a preparation chamber (4) for subjecting the substrates (not shown) to a cleaning treatment and a growth chamber (5) for forming a thin film on each substrate. Transfer manipulators (6), (7) and (8) are provided to transfer the substrates into the loading chamber (1), the preparation chamber (4) and the growth chamber (5), respectively. Also, a transfer manipulator (9) is provided to take the substrates after epitaxial growth out of an unloading chamber (10). Furthermore, the loading chamber (1) is removably mounted to the apparatus through easily separable means such as two pairs of flanges (11) and (12). Although the flanges (11) and (12) are used in this embodiment, whatever other easily separable means may be employed. Gate valves (13) and (14) are provided to maintain a vacuum in the loading chamber (1) during the separation of the same from the apparatus. A loading flange (15) is provided to open or close the loading chamber (1) when the substrates P are introduced thereinto, and is equipped with a cassette (16) for receiving the substrates P. In the loading chamber (1), there is provided an exhaust port (17) through which the loading chamber (1) can be connected to a vacuum pump (not shown), and there are provided a shroud (18) and nozzles (19) and (20) which form a cryo-panel when a refrigerant is circulated therein. Within the shroud (18), a heater (21) is disposed for baking the substrates.

When the loading chamber (1) is dismounted from the apparatus, conduit portions of the apparatus between the valve (14) and the flange (12) and between the valve (13) and the valve (2) are exposed to atmosphere, respectively. There are provided exhaust ports (not shown) in these conduit portions so that evacuation thereof can be carried out by a vacuum pump after the loading chamber is remounted to the apparatus.

Figure 3:
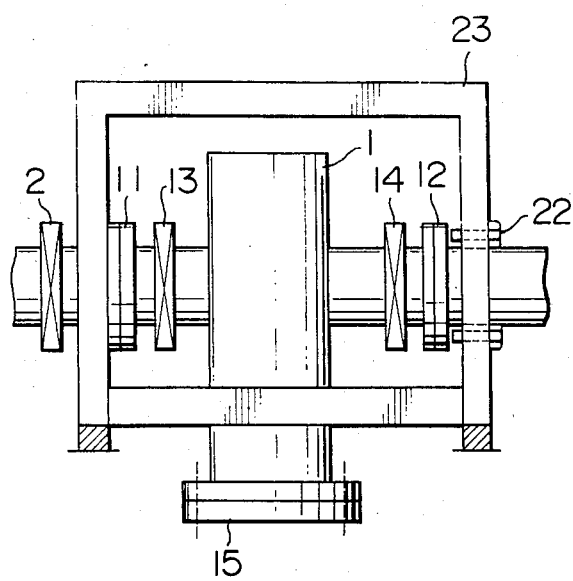
FIG. 3 is an explanatory view showing the way of mounting of the loading chamber.

The loading chamber (1) is mounted or dismounted by means of a mounting jig as shown in FIG. 3. More specifically, the mounting jig has a construction wherein a fixing frame (23) is secured to the flanges (11) and (12) on the apparatus side by means of bolts (22) in such way that the loading chamber (1) may be easily separated at the flanges (11) and (12).

The operation of the MBE apparatus according to the above embodiment of the invention will be described hereinunder. The gate valves (2), (13) and (14) are first closed and the loading chamber (1) is separated at the flanges (11) and (12) from the apparatus, while a complete cleaning treatment for enabling a thin film to grow is being carried out on the substrates which have been transferred into the preparation chamber (4). After the separation of the loading chamber, another loading chamber containing substrates which have been pre-cleaned is mounted to the apparatus in preparation for the subsequent transfer. When the mounting of the other chamber has been completed, the evacuation of the conduit portions between the valve (14) and the flange (12) and between the valves (2) and (13) is carried out in such a manner as described hereinbefore. After a predetermined time elapsed, the valves (13) and (14) are opened so that the conduit portions are evacuated as well as the loading chamber. Meanwhile, in the separated loading chamber (1), another cleaning treatment is carried out on the substrates introduced thereinto with the aid of exclusive means separately provided for this purpose. More specifically, the substrates P are introduced into the separated chamber, and subjected to a baking treatment by means of the heater (21) while the chamber is evacuated by a vacuum pump. After a predetermined time has elapsed, the baking treatment is stopped, and a refrigerant such as liquid nitrogen is then circulated within the shroud (18) in order to achieve a higher degree of vacuum (near the vacuum in the transfer chamber (13)) in the loading chamber by the exhaust action of a cryo-panel to finish the cleaning treatment. By preparing a necessary number of such loading chambers finished with the above treatment, the apparatus can be operated efficiently to improve in productivity.

As described above, according to the present embodiment, the loading chamber is made separable from the apparatus and the vacuum exhaust port is provided in the loading chamber. By virtue of this construction, it is possible to attain the effect that the time period necessary for evacuation is reduced by alternately mounting the loading chambers which have contained the substrates and have been pre-evacuated, thus realizing an increased productivity.

Figure 4:
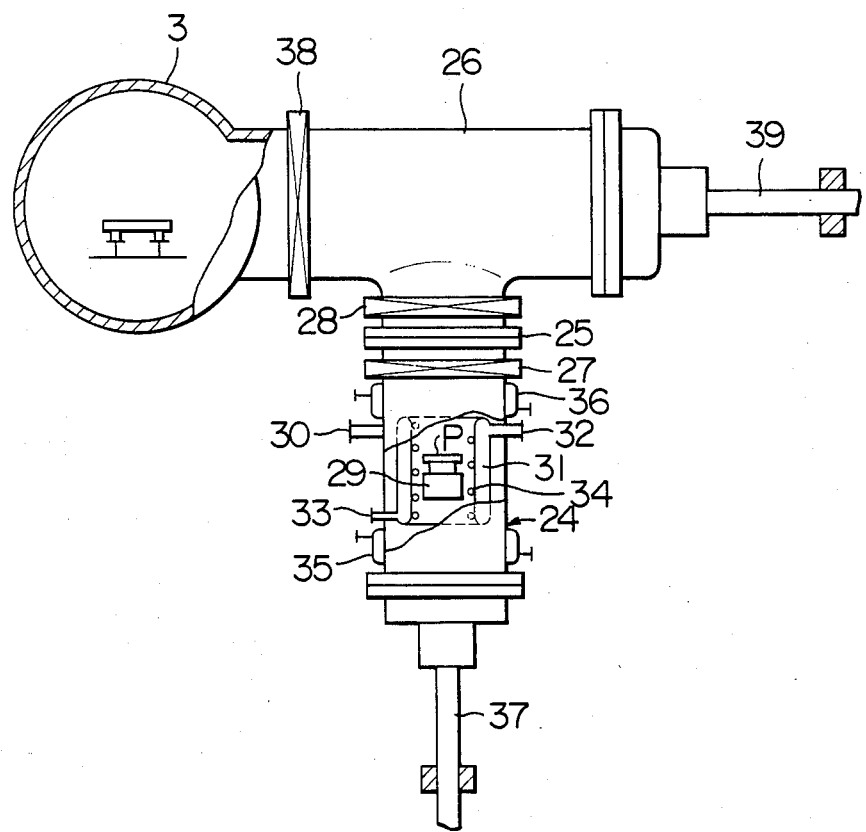
FIG. 4 is a partially cutaway view of a MBE apparatus according to another embodiment of the invention.

FIG. 4 shows another embodiment of the invention, which has a substrate storage chamber for temporarily holding substrates therein formed between loading and transfer chambers, thus achieving a MBE apparatus further improved in productivity. The loading chamber (24) is removably mounted to the substrate storage chamber (26) via a pair of flanges (25). Gate valves (27) and (28) are provided so as to keep the vacuum in the loading chamber (24) and that in the substrate storage chamber (26), respectively, when the former chamber (24) is separated from the apparatus. In a cassette (29) are received the substrates P. In the loading chamber (24), an exhaust port (30) is provided so as to be connected to a vacuum pump (not shown), and there is provided a heater (34) for the baking treatment as well as a shroud (31) and nozzles (32) and (33) by means of which a refrigerant can be circulated. On the opposite ends of the loading chamber (24), there are formed a pair of shrouds (35) and (36) adapted to circulate a refrigerant in order to prevent the flanges from being deformed due to heat. A transfer manipulator (37) is also provided to transfer the substrates P. On the other hand, the substrate storage chamber (26) is provided with a gate valve (38) and a transfer manipulator (39) for transferring the substrates P. Conduit portions between the valves (27) and (28) are evacuated for a predetermined time period through an exhaust port (not shown) provided in either conduit portion, and the valves (27) and (28) are then opened.

This embodiment is similar to the first described embodiment in that the loading chamber (24) is separable from the apparatus and the cleaning treatment of the substrates P is carried out in the separated loading chamber with the aid of separately provided exclusive means as is in the case of the first embodiment. In this embodiment, however, it is possible to shorten the necessary time period for evacuating the transfer chamber as compared with the first embodiment by virtue of the provision of the substrate storage chamber. Namely, even when the gate valve (38) is opened after the mounting of the loading chamber, the degree of vacuum in the substrate storage chamber (26) is still higher than that in the loading chamber (1) of the first embodiment and thus, loss in vacuum of the transfer chamber (3) is relatively small so that the time period necessary for recovering the vacuum in the transfer chamber may be shortened.

As described above, by virtue of the provision of the substrate storage chamber, the present embodiment offers the effect of shortening the evacuation time for the transfer chamber in addition to those of the first embodiment to further improve in productivity.

Both the above embodiments have been described to have the construction in which the preparation chamber, the growth chamber and the loading chamber and interconnected via the transfer chamber. It is to be noted, however, that the same advantageous effects as those of the above embodiments can be attained with respect to a MBE apparatus of the type that the preparation chamber as well as the growth chamber is directly connected to the loading chamber, if the loading chamber is made separable from the apparatus and a plurality of such loading chambers evacuated separately from the apparatus are alternately mounted thereto.

What is claimed is:

1. A molecular beam epitaxy apparatus comprising: preparation chamber means for subjecting substrates to a cleaning treatment; growth chamber means for forming thin films onto the respective substrates by means of an epitaxial growth process; loading chamber means for introducing from an atmospheric environment a predetermined number of the substrates and temporarily holding the same therein; transfer chamber means for transferring the substrates from said loading chamber means to said preparation chamber means and from said preparation chamber means to said growth chamber means; mounting means provided between said transfer chamber means and said loading chamber means for dismounting said loading chamber means from said transfer chamber means when all the substrates introduced into said loading chamber means are transferred to said transfer chamber means and for remounting said dismounted loading chamber means to said transfer chamber means when the predetermined number of substrates are newly introduced into said dismounted loading chamber means; and exhaust port means provided in said loading chamber means for evacuation thereof.

2. The apparatus according to claim 1, wherein said mounting means comprises a gate valve provided on the transfer chamber means side, a gate valve provided on the loading chamber means side, and flanges removably provided between said valves.

3. The apparatus according to claim 2, further comprising means for carrying out another cleaning treatment on the substrates provided within said loading chamber means.

4. The apparatus according to claim 3, wherein said means for carrying out another cleaning treatment includes evacuation means and baking means.

5. The apparatus according to claim 4, wherein said evacuation means comprises a shroud for circulating a refrigerant therein and said baking means comprises a heater.

6. A molecular beam epitaxy apparatus comprising: preparation chamber means for subjecting substrates to a cleaning treatment; growth chamber means for forming thin films onto the respective substrates by means of an epitaxial growth process; loading chamber means for introducing from atmospheric environment a predetermined number of the substrates and temporarily holding the same therein; transfer chamber means for transferring the substrates from said loading chamber means to said preparation chamber means and from said preparation chamber means to said growth chamber means; substrate storage chamber means between said loading chamber means and said transfer chamber means for temporarily holding the substrates therein, connected to said transfer chamber means through vacuum connection means; mounting means provided between said substrate storage chamber means and said loading chamber means for dismounting said loading chamber means from said substrate storage chamber means when all the substrates introduced into said loading chamber means are transferred to said substrate storage chamber means and for remounting said dismounted loading chamber means to said substrate storage chamber means when the predetermined number of substrates are newly introduced into said dismounted loading chamber means; and exhaust port means provided in said loading chamber means for evacuation thereof.

* * * * *